United States Patent
Yokota et al.

(10) Patent No.: US 10,651,012 B2
(45) Date of Patent: May 12, 2020

(54) SUBSTRATE PROCESSING METHOD

(71) Applicant: TOKYO ELECTRON LIMITED, Tokyo (JP)

(72) Inventors: Akihiro Yokota, Miyagi (JP); Etsuji Ito, Miyagi (JP); Shinji Himori, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 385 days.

(21) Appl. No.: 15/378,590

(22) Filed: Dec. 14, 2016

(65) Prior Publication Data
US 2017/0162367 A1    Jun. 8, 2017

Related U.S. Application Data

(62) Division of application No. 14/370,579, filed as application No. PCT/JP2013/051362 on Jan. 17, 2013, now abandoned.
(Continued)

(30) Foreign Application Priority Data

Jan. 18, 2012    (JP) .................................. 2012-008019

(51) Int. Cl.
*C23C 14/34*    (2006.01)
*H01J 37/32*    (2006.01)
(Continued)

(52) U.S. Cl.
CPC .... *H01J 37/32091* (2013.01); *C23C 14/3492* (2013.01); *C23C 14/35* (2013.01);
(Continued)

(58) Field of Classification Search
CPC ..... C23C 14/54; C23C 14/3492; C23C 14/35; H01J 37/3266; H01J 37/32669
See application file for complete search history.

(56) References Cited

U.S. PATENT DOCUMENTS 5,733,405 A * 3/1998 Taki .................. H01J 37/32623
                                                    118/723 E
6,022,446 A    2/2000 Shan et al.
(Continued)

FOREIGN PATENT DOCUMENTS

JP    H01065132 U    4/1989
JP    H04080385 U    3/1992
(Continued)

OTHER PUBLICATIONS

"Electromagnet." Britannica Academic, Encyclopdia Britannica, Apr. 8, 2019. academic.eb.com/levels/collegiate/article/electromagnet/32309. Accessed Jul. 19, 2019. (Year: 2019).*
(Continued)

*Primary Examiner* — Jason Berman
(74) *Attorney, Agent, or Firm* — Brundidge & Stanger, P.C.

(57) ABSTRACT

A substrate processing method performed by a substrate processing apparatus is provided. The substrate processing method comprises: setting a magnetic pole on a processing space side of each electromagnet belonging to one of first, second and third electromagnet groups to be different from a magnetic pole on the processing space side of each electromagnet belonging to the other two electromagnet groups; generating an electric field by applying a high frequency power to a lower electrode; and performing a first process on the substrate with plasma generated by the electric field.

8 Claims, 12 Drawing Sheets

Related U.S. Application Data

(60) Provisional application No. 61/592,213, filed on Jan. 30, 2012.

(51) Int. Cl.
| | |
|---|---|
| *H01L 21/768* | (2006.01) |
| *H01L 21/3065* | (2006.01) |
| *C23C 14/35* | (2006.01) |
| *C23C 14/54* | (2006.01) |
| *H01L 21/67* | (2006.01) |

(52) U.S. Cl.
CPC .......... *C23C 14/54* (2013.01); *H01J 37/3266* (2013.01); *H01J 37/32669* (2013.01); *H01L 21/3065* (2013.01); *H01L 21/67069* (2013.01); *H01L 21/76898* (2013.01); *H01J 2237/334* (2013.01)

(56) References Cited

U.S. PATENT DOCUMENTS

2004/0050690 A1 * 3/2004 Green ................ H01J 37/3408
                                                    204/192.13
2008/0113149 A1    5/2008  Egami
2009/0047795 A1    2/2009  Matsudo

FOREIGN PATENT DOCUMENTS

| | | |
|---|---|---|
| JP | H09139380 A | 5/1997 |
| JP | 3037848 B2 | 2/2000 |
| JP | 2000200696 A | 7/2000 |
| JP | 2002313784 A | 10/2002 |
| JP | 3375302 B2 | 11/2002 |
| JP | 2007266533 A | 10/2007 |
| JP | 4107518 B2 | 4/2008 |
| JP | 2009071292 A | 4/2009 |
| KR | 10-2011-0113634 A | 10/2011 |
| TW | 314685 B | 9/1997 |
| TW | 511398 B | 11/2002 |
| WO | 0223588 A2 | 3/2002 |
| WO | 2010/083912 A1 | 7/2010 |

OTHER PUBLICATIONS

International Search Report of PCT/JP2013/051362 dated Apr. 16, 2013, 4 pages.

* cited by examiner

SUBSTRATE PROCESSING METHOD

CROSS-REFERENCE TO RELATED APPLICATION

This is a divisional application of U.S. patent application Ser. No. 14/370,579, filed on Jul. 3, 2014, which is a U.S. national phase application under 35 U.S.C. § 371 of PCT Application No. PCT/JP2013/051362 filed on Jan. 17, 2013, which claims the benefit of Japanese Patent Application No. 2012-008019 filed on Jan. 18, 2012, and U.S. Provisional Application Ser. No. 61/592,213 filed on Jan. 30, 2012, the entire disclosures of which are incorporated herein by reference.

TECHNICAL FIELD

The embodiments described herein pertain generally to a substrate processing method of controlling a plasma density distribution by using a magnetic field.

BACKGROUND

Conventionally, there has been known a substrate processing apparatus that controls a plasma density distribution by generating a magnetic field in a processing space where an electric field is present. In this substrate processing apparatus, electrons make a drift motion with a Lorentz force caused by the electric field and the magnetic field in the processing space into which a processing gas is introduced to be collided with molecules or atoms of the processing gas, so that plasma is generated.

By way of example, a conventional magnetron plasma processing apparatus includes a dipole ring magnet formed of multiple columnar anisotropic segment magnets arranged in a ring shape at an outside of a chamber, and as shown in FIG. 11, a uniform horizontal magnetic field B as a whole is formed by slightly deviating a direction of magnetization caused by the multiple columnar anisotropic segment magnets (see, for example, Patent Document 1). Further, FIG. 11 is a diagram (plane view) of the conventional magnetron plasma processing apparatus as viewed from above, and shows that a base end side of the direction of the magnetic field is indicated by N, a leading end side thereof is indicated by S, and positions rotated by 90° from N and S are respectively indicated by E and W.

However, the horizontal magnetic field B formed by the dipole ring magnet is directed only in one direction from N to S in the diagram. Further, in this magnetron plasma processing apparatus, the electric field is formed downward, so that the electrons travel from E to W by the drift motion by a Lorentz force. Consequently, plasma density is low on the E side and high on the W side, so that a plasma density distribution becomes non-uniform.

To solve this problem, the dipole ring magnet is rotated in its circumferential direction to change the direction of the drift motion of electrons. In practice, however, it is difficult to make the plasma density distribution uniform only by rotating the dipole ring magnet.

Further, there has been known a conventional magnetron etching apparatus including a rotary magnet as shown in FIG. 12.

This magnetron etching apparatus 120 includes a processing chamber 121, an upper electrode 122 and a lower electrode 123 provided to face each other in a vertical direction within the processing chamber 121, a magnet 124 which has a substantially circular plate shape and is provided to be rotated above or at an outside of the upper electrode 122, and a high frequency power supply 125 that applies a high frequency power to a space between the upper electrode 122 and the lower electrode 123. Further, a wafer W is provided within the processing chamber 121 (see, for example, Patent Document 2).

The magnet 124 provided above or at the outside of the upper electrode 122 generates a magnetic field B along a surface of the wafer W within the processing chamber 121. The magnet 124 is rotated at a desired rotation speed by a driving device (not illustrated) such as a motor or the like in a horizontal plane parallel to a surface of the wafer W. As a result, the magnetic field B is formed to be intersected with an electric field E applied into a space within the processing chamber 121.

In this magnetron etching apparatus 120, when a time average is taken, plasma density becomes uniform above the wafer W, but at each moment, the plasma density is still non-uniform. Further, by a drift motion of charged particles, for example, electrons, caused by a Lorentz force, the plasma density and an etching speed (etching rate) on the surface of the wafer W decreases in one direction and an electric potential ($V_{DC}$) increases. That is, since the plasma density becomes non-uniform and an electric potential also becomes non-uniform, charged regions polarized positively and negatively are respectively formed at both ends of the wafer W (charge-up phenomenon).

Therefore, in order to remove the non-uniformity in plasma density distribution described in Patent Document 1 and Patent Document 2, the present applicant suggests a plasma processing apparatus that generates a magnetic field symmetric with respect to a central portion of the wafer W in a processing space. To be specific, as illustrated in FIG. 13, in a plasma processing apparatus 130, multiple permanent magnets 132 are arranged in multiple annular circles with respect to the central portion of the wafer W on an upper surface of a processing chamber 131 facing the wafer W, and a magnetic pole from each permanent magnet 132 toward the wafer W is adjusted. As a result, a magnetic field B radially distributed from the central portion of the wafer W in the processing space is generated (see, for example, Patent Document 3). Thus, electrons are rotated above the wafer W around the central portion of the wafer W by the drift motion with a Lorentz force, so that the plasma density does not simply decrease or increase in one direction and plasma is distributed symmetrically with respect to the central portion of the wafer W. As a result, non-uniformity in plasma density is removed.

REFERENCES

Patent Document 1: Japanese Patent Publication No. 3375302

Patent Document 2: Japanese Patent Publication No. 3037848

Patent Document 3: Japanese Patent Publication No. 4107518

DISCLOSURE OF THE INVENTION

Problems to be Solved by the Invention

However, when a condition of a plasma process to be performed on a wafer W is modified, there may be a change in a plasma density distribution in a processing space. For this reason, it may be necessary to correct non-uniformity in plasma density by changing a distribution of a magnetic field (magnetic flux density or direction of the magnetic flux) generated within a processing chamber.

However, in the plasma processing apparatus of Patent Document 3, since the permanent magnets 132 are used to generate the magnetic field B, in order to change the magnetic flux density within the processing chamber, positions of the permanent magnets 132 with respect to the processing chamber need to be changed. In order to change the positions of the permanent magnets 132, for example, a magnet driving device needs to be provided, so that a configuration of the plasma processing apparatus becomes complicated. Further, in order to change the magnetic flux direction within the processing chamber, a magnetic pole on a processing chamber side of each magnet needs to be changed. However, it is difficult to change a magnetic pole of the permanent magnet 132. That is, in this plasma processing apparatus generating a magnetic field by using the permanent magnets as described in Patent Document 3, it is difficult to obtain an optimum magnetic field distribution in response to a change in the plasma density distribution within the processing space.

In view of the foregoing, example embodiments provide a substrate processing apparatus capable of obtaining a magnetic field distribution that allows a plasma density distribution in a processing space to be optimized.

Means for Solving the Problems

In one example embodiment, a substrate processing method performed by a substrate processing apparatus is provided. The substrate processing apparatus generates an electric field in a processing space between a lower electrode to which a high frequency power is applied and an upper electrode provided to face the lower electrode, and performs a plasma process on a substrate mounted on the lower electrode with plasma generated by the electric field. The substrate processing apparatus comprises multiple electromagnets arranged on a top surface of the upper electrode opposite to the processing space, wherein each of the electromagnets is radially arranged with respect to a central portion of the upper electrode facing a central portion of the substrate, the multiple electromagnets are divided into a first electromagnet group, a second electromagnet group, and a third electromagnet group, the first electromagnet group includes the electromagnets facing the central portion of the substrate, the second electromagnet group includes the electromagnets facing a peripheral portion of the substrate, and the third electromagnet group includes the electromagnets arranged on an outside of the second electromagnet group with respect to the central portion of the upper electrode without facing the substrate, and magnetic poles on the processing space side of the electromagnets belonging to the first electromagnet group are identical to each other, magnetic poles on the processing space side of the electromagnets belonging to the second electromagnet group are identical to each other, and magnetic poles on the processing space side of the electromagnets belonging to the third electromagnet group are identical to each other. The substrate processing method comprises: setting a magnetic pole on the processing space side of each electromagnet belonging to one of the first, second and third electromagnet groups to be different from a magnetic pole on the processing space side of each electromagnet belonging to the other two electromagnet groups; generating the electric field by applying the high frequency power to the lower electrode; and performing a first process on the substrate with the plasma generated by the electric field.

The magnetic pole on the processing space side of each electromagnet belonging to the first electromagnet group may be set as an N pole, the magnetic pole on the processing space side of each electromagnet belonging to the second electromagnet group may be set as an S pole, and an electric current may not be applied to each electromagnet belonging to the third electromagnet group not to generate a magnetic flux.

An electric current may not be applied to each electromagnet belonging to the first electromagnet group not to generate a magnetic flux, the magnetic pole on the processing space side of each electromagnet belonging to the second electromagnet group may be set as an S pole, and the magnetic pole on the processing space side of each electromagnet belonging to the third electromagnet group may be set as an N pole.

The magnetic pole on the processing space side of each electromagnet belonging to the first electromagnet group and the third electromagnet group may be set as an N pole and the magnetic pole on the processing space side of each electromagnet belonging to the second electromagnet group may be set as an S pole.

The magnetic pole on the processing space side of each electromagnet belonging to the first electromagnet group may be set as an N pole, and the magnetic pole on the processing space side of each electromagnet belonging to the second electromagnet group and the third electromagnet group may be set as an S pole.

The magnetic pole on the processing space side of each electromagnet belonging to the first electromagnet group and the second electromagnet group may be set as an N pole and the magnetic pole on the processing space side of each electromagnet belonging to the third electromagnet group may be set as an S pole.

The magnetic pole on the processing space side of each electromagnet belonging to the first electromagnet group may be set as an N pole, an electric current may not be applied to each electromagnet belonging to the second electromagnet group not to generate magnetic flux, and the magnetic pole on the processing space side of each electromagnet belonging to the third electromagnet group may be set as an S pole.

The substrate processing method may further comprise performing a second process on the substrate after performing the first process. A first high frequency power supply that is configured to supply a high frequency power having a first high frequency and a second high frequency power supply that is configured to supply a high frequency power having a second high frequency higher than the first high frequency may be connected to the lower electrode. In the step of performing the first process, the second frequency power supply may be configured to supply the high frequency power having the second high frequency, and in the step of performing the second process, the first frequency power supply may be configured to supply the high frequency power having the first high frequency, and an electric current may not be applied to each electromagnet belonging to the first, second and third electromagnet group not to generate a magnetic flux.

Effect of the Invention

In accordance with the example embodiments, multiple electromagnets are arranged on a top surface of an upper electrode opposite to a processing space in a substrate processing apparatus. Since each of the electromagnets are radially arranged with respect to a central portion of the upper electrode facing a central portion of a substrate, a magnetic field radially distributed with respect to the central portion of the substrate can be generated in the processing space. Further, by controlling a direction or a magnitude of an electric current flowing in each electromagnet, it is possible to easily control intensity or a magnetic flux direction of a magnetic field to be generated. As a result, it is possible to obtain a magnetic field distribution that allows a plasma density distribution in a processing space to be optimized.

MODE FOR CARRYING OUT THE INVENTION

Hereinafter, example embodiments will be explained with reference to the accompanying drawings.

Firstly, a substrate processing apparatus in accordance with a first example embodiment will be explained.

Figure 1A:
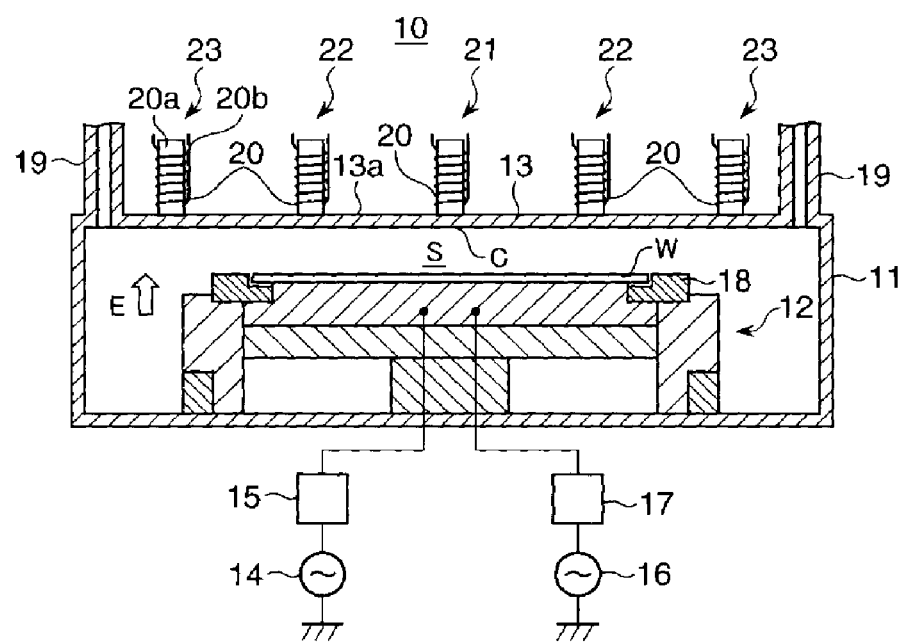
FIG. 1A is a cross-sectional view schematically showing a configuration of a substrate processing apparatus in accordance with a first example embodiment.
Figure 1B:
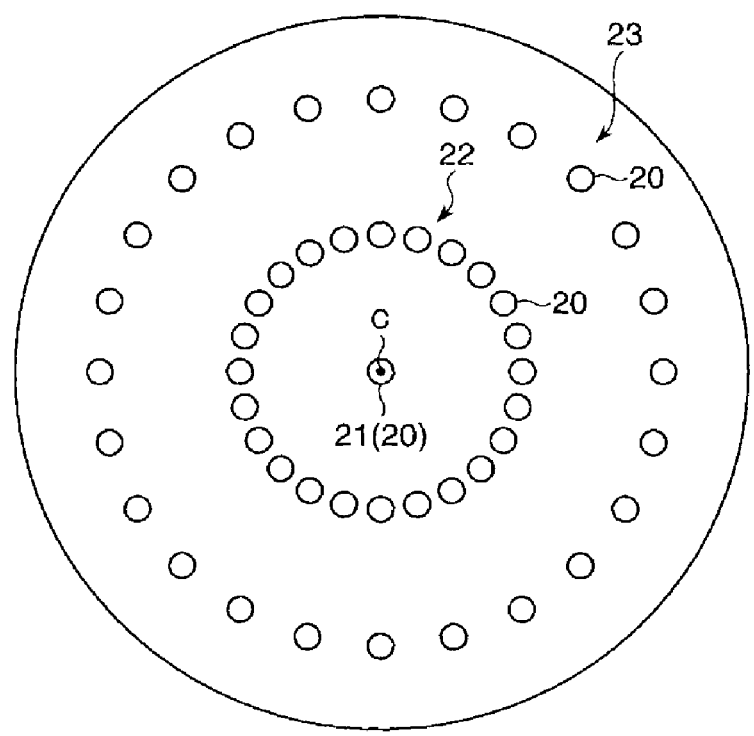
FIG. 1B is a diagram schematically showing a configuration of the substrate processing apparatus in accordance with the present example embodiment, and shows an upper electrode of the substrate processing apparatus when viewed along a white arrow of FIG. 1A.

FIG. 1A and FIG. 1B schematically show configurations of the substrate processing apparatus in accordance with the present example embodiment. FIG. 1A is a cross-sectional view of the substrate processing apparatus, and FIG. 1B is a diagram showing an upper electrode of the substrate processing apparatus when viewed along a white arrow of FIG. 1A. The substrate processing apparatus is configured to perform a plasma process, for example, a dry etching process, on a wafer for a semiconductor device (hereinafter, simply referred to as "wafer") Was a substrate.

In FIG. 1A, a substrate processing apparatus 10 includes a cylinder-shaped chamber 11 (processing chamber) that accommodates therein the wafer W having a diameter of, for example, about 300 mm. Within the chamber 11, a cylinder-shaped susceptor 12 (lower electrode) configured to mount thereon the wafer W is provided at a lower side, and a ceiling portion of the chamber 11, facing the susceptor 12, is configured as an upper electrode 13. A processing space S is formed between the susceptor 12 and the upper electrode 13.

In the substrate processing apparatus 10, plasma is generated in the processing space S depressurized by a non-illustrated exhaust device, and a plasma process is performed on the wafer W mounted on the susceptor 12 with the plasma.

The susceptor 12 within the chamber 11 is connected to a first high frequency power supply 14 via a first matching unit 15 and to a second high frequency power supply 16 via a second matching unit 17. The first high frequency power supply 14 is configured to apply a high frequency power having a higher frequency of, for example, about 60 MHz to the susceptor 12, and the second high frequency power supply 16 is configured to apply a high frequency power having a lower frequency of, for example, about 3.2 MHz to the susceptor 12. Thus, the susceptor 12 serves as a lower electrode. Further, the first matching unit 15 and the second matching unit 17 are configured to control impedance to allow the high frequency powers to be efficiently applied to the susceptor 12, respectively.

At the upper peripheral portion of the susceptor 12, a step-shaped portion is formed such that a central portion of the susceptor 12 protrudes upward in the drawing. At a front end of the central portion of the susceptor 12, an electrostatic chuck (not illustrated), which is made of ceramic and has an electrostatic electrode plate therein, is provided. The electrostatic chuck is configured to attract and hold the wafer W with a Coulomb force or a Johnsen-Rahbek force.

On the step-shaped portion at the upper peripheral portion of the susceptor 12, a focus ring 18 is mounted to surround the wafer W attracted to and held by the electrostatic chuck. The focus ring 18 is made of silicon (Si) or silicon carbide (SiC), and is configured to extend a plasma distribution area in the processing space S to above the wafer W and also to above the focus ring 18. The ceiling portion of the chamber 11 facing the susceptor 12 with the processing space S interposed therebetween is connected to a processing gas inlet line 19, and the processing gas inlet line 19 introduces a processing gas to the processing space S.

In the substrate processing apparatus 10, the processing gas is introduced into the processing space S through the processing gas inlet line 19, and an electric field E is generated in a direction as indicated by a white arrow in the drawing, i.e., from the susceptor 12 toward the upper electrode 13, within the processing space S by applying the high frequency powers to the susceptor 12 from the first high frequency power supply 14 and the second high frequency power supply 16. The electric field E generates plasma by exciting molecules or atoms of the introduced processing gas. Here, radicals in the plasma drift and move to the wafer W. Further, positive ions in the plasma are attracted toward the wafer W by applying the high frequency powers to the susceptor 12 from the first high frequency power supply 14 and the second high frequency power supply 16, so that a plasma process is performed on this wafer W.

Further, the substrate processing apparatus 10 includes multiple electromagnets 20 arranged in a substantially radial shape on a top surface 13a of the upper electrode 13 opposite to the processing space S. Each electromagnet 20 includes a rod-shaped yoke 20a formed of an iron core and a coil 20b which is formed of a conducting wire wound on a side surface of the yoke 20a. Here, both ends of the coil 20b are drawn out. A value of an electric current or a direction of an electric current flowing in the coil 20b of the electromagnet 20 is controlled by a controller (not illustrated), so that it is possible to selectively change the total magnetic flux or a direction of the magnetic flux generated by this electromagnet 20.

In the substrate processing apparatus 10, as depicted in FIG. 1B, the multiple electromagnets 20 are divided into a central portion facing group 21 (first electromagnet group) including the electromagnet 20 facing the central portion of the wafer W; a peripheral portion facing group 22 (second electromagnet group) including multiple electromagnets 20 which are arranged in a circular ring shape with respect to a central portion C of the upper electrode 13 (hereinafter, referred to as "upper electrode central portion C") facing the central portion of the wafer W and face the peripheral portion of the wafer W; and an outer portion facing group (third electromagnet group) including multiple electromagnets 20 which are arranged in a circular ring shape with respect to the upper electrode central portion C and arranged at an outside of the peripheral portion facing group 22 without facing the wafer W. In the substrate processing apparatus 10, a direction of the electric current flowing in the coil 20b of each electromagnet 20 is controlled such that magnetic poles on the processing space S side of the respective electromagnets 20 belonging to the peripheral portion facing group 22 are identical to each other, and a direction of the electric current flowing in the coil 20b of each electromagnet 20 is controlled such that magnetic poles on the processing space S side of the respective electromagnets 20 belonging to the outer portion facing group 23 are identical to each other.

In the present example embodiment, the central portion facing group 21 has a single electromagnet 20 in the drawing, but may be formed of multiple electromagnets 20 arranged in a circular ring shape with respect to the upper electrode central portion C facing the central portion of the wafer W.

Further, when the upper electrode 13 of the substrate processing apparatus 10 is viewed from the processing space S along a white arrow of FIG. 1A, since the upper electrode 13 is not transparent, each electromagnet 20 arranged on the top surface 13a of the upper electrode 13 cannot be seen. However, in the drawing, in order to easily explain arrangement of the electromagnets 20, the upper electrode 13 is set to be transparent in the present example embodiment, so that the arrangement of the electromagnets 20 can be seen through the upper electrode 13, which will be the same in FIG. 2B and FIG. 8B to be described later.

Figure 2A:
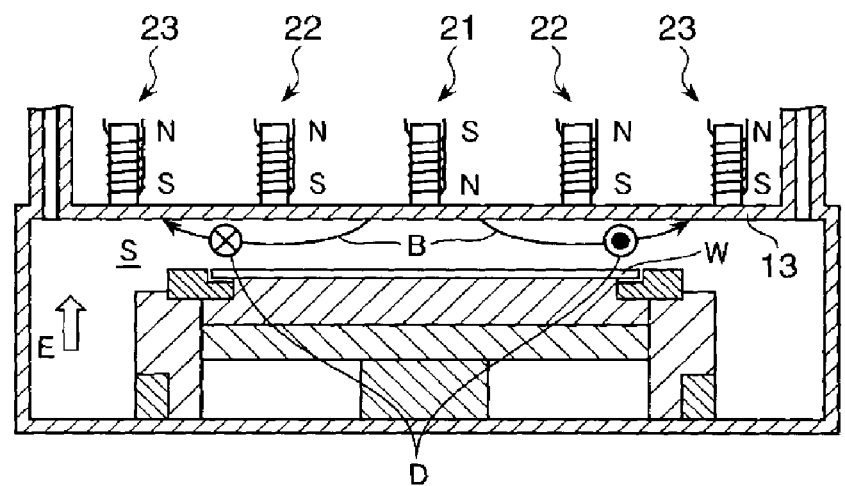
FIG. 2A is a diagram for explaining a drift motion of electrons caused by an electric field and a magnetic field generated in the substrate processing apparatus of FIG. 1A and FIG. 1B, and is a cross-sectional view of the substrate processing apparatus of FIG. 1A and FIG. 1B.
Figure 2B:
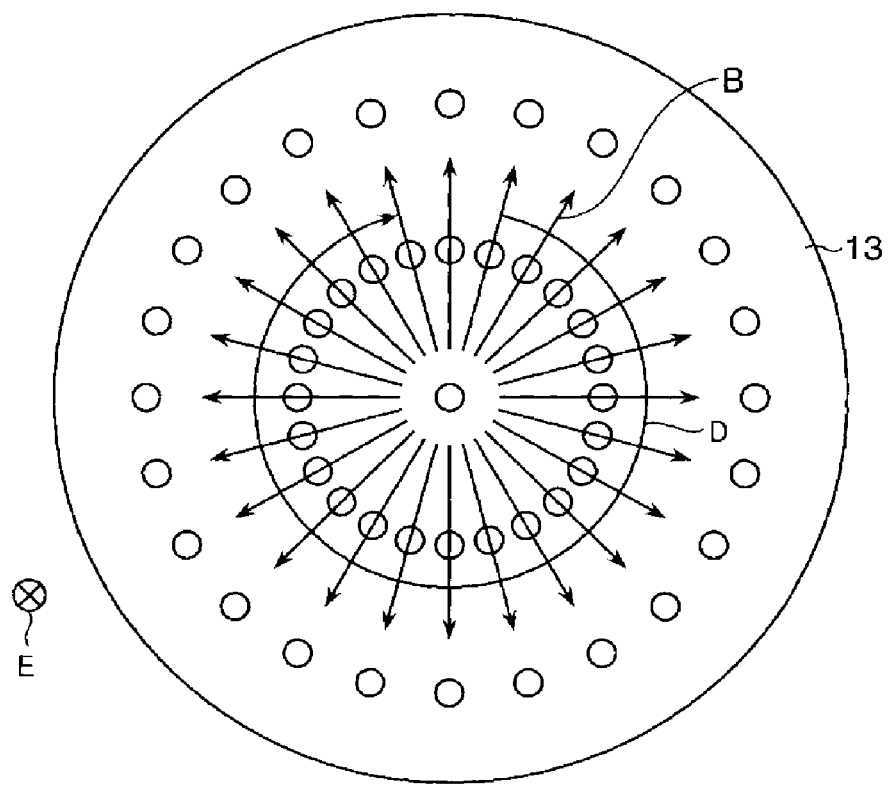
FIG. 2B is a diagram for explaining the drift motion of the electrons caused by the electric field and the magnetic field generated in the substrate processing apparatus of FIG. 1A and FIG. 1B, and shows an upper electrode of the substrate processing apparatus when viewed along a white arrow of FIG. 2A.

FIG. 2A and FIG. 2B are diagrams for explaining a drift motion of electrons caused by an electric field and a magnetic field generated in the substrate processing apparatus of FIG. 1A and FIG. 1B, and FIG. 2A is a cross-sectional view of the substrate processing apparatus of FIG. 1A and FIG. 1B, and FIG. 2B is a diagram showing an upper electrode of the substrate processing apparatus when viewed along a white arrow of FIG. 2A.

In the plasma processing apparatus 10, for example, as depicted in FIG. 2A, if a magnetic pole on the processing space S side of the electromagnet 20 belonging to the central portion facing group 21 is set as an N pole, and a magnetic pole on the processing space S side of each electromagnet 20 belonging to the peripheral portion facing group 22 and the outer portion facing group 23 is set as an S pole, a magnetic field B in a radial shape is generated from the central portion facing group 21 toward the peripheral portion facing group 22 and the outer portion facing group 23. Here, as described above, since the electric field E is generated within the processing space S, electrons within the processing space S are drifted by a Lorentz force caused by the electric field E and the magnetic field B in the processing space S. To be specific, the electric field E is generated from a front side toward an inner side of FIG. 2B, and the magnetic field B is generated in a radial shape with respect to the upper electrode central portion C. Therefore, the electrons are accelerated in a tangent direction of the circumference around the upper electrode central portion C and rotated along a circular electron trajectory D around the upper electrode central portion C according to the Fleming's left-hand rule. Here, the rotated electrons are collided with molecules or atoms of the processing gas within the processing space S to generate plasma. As a result, circular ring-shaped plasma is generated along the circular electron trajectory D.

A speed (vgE) of the drift motion of the electrons caused by the electric field and the magnetic field is expressed by the following equation (1).

$$vgE = E/B \quad (1)$$

According to the equation (1), when intensity of the electric field E is uniform, as intensity of the magnetic field B (magnetic field intensity) is increased, a speed of the drift motion of the electrons is decreased. If the speed of the drift motion of the electrons is decreased, a staying time of the electrons at a certain location becomes long, so that electron density is increased at this location. As a result, since the electrons are collided with molecules or atoms of the processing gas more frequently, the plasma density is increased at this location. That is, if the magnetic field intensity at a certain location is increased by the electromagnets 20, the plasma density at this location can be increased.

Therefore, by controlling the magnetic pole on the processing space S side of each electromagnet 20 belonging to the central portion facing group 21, the peripheral portion facing group 22, and the outer portion facing group 23, a distribution of the magnetic field B generated in the processing space S is changed to allow the magnetic field intensity to be high at a desired location, so that the plasma density at the desired location can be increased.

FIG. 3A to FIG. 3C and FIG. 4A to FIG. 4C are diagrams for explaining a relationship between a magnetic pole on the processing space side of each electromagnet and intensity of a magnetic field generated in the processing space.

Figure 3A:
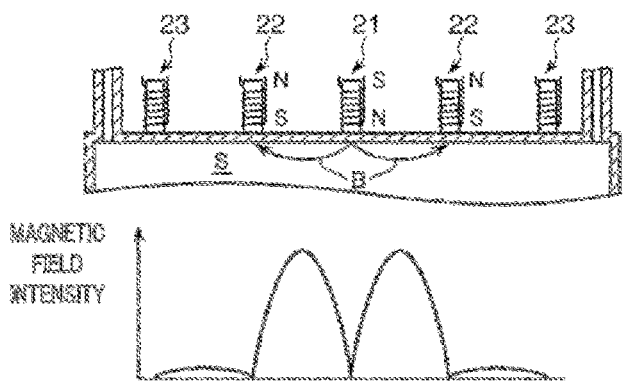
FIG. 3A is a diagram for explaining a relationship between a magnetic pole on a processing space side of each electromagnet and intensity of the magnetic field generated in a processing space.

FIG. 3A illustrates a case where the magnetic pole on the processing space S side of the electromagnet 20 belonging to the central portion facing group 21 is set as the N pole; the magnetic pole on the processing space S side of each electromagnet 20 belonging to the peripheral portion facing group 22 is set as the S pole; and an electric current is not applied to the coil 20b of each electromagnet 20 belonging to the outer portion facing group 23 not to generate the magnetic flux.

In this case, a magnetic field B is generated from the central portion facing group 21 toward the peripheral portion facing group 22, and the magnetic field intensity becomes maximized between the central portion facing group 21 and the peripheral portion facing group 22, so that the plasma density between the central portion facing group 21 and the peripheral portion facing group 22 can be increased.

Figure 3B:
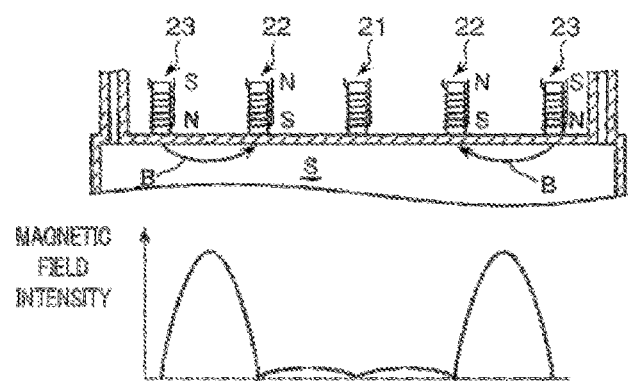
FIG. 3B is a diagram for explaining a relationship between a magnetic pole on a processing space side of each electromagnet and intensity of a magnetic field generated in the processing space.

FIG. 3B illustrates a case where an electric current is not applied to the coil 20b of the electromagnet 20 belonging to the central portion facing group 21 and the magnetic flux is not generated; the magnetic pole on the processing space S side of each electromagnet 20 belonging to the peripheral portion facing group 22 is set as the S pole; and the magnetic pole on the processing space S side of each electromagnet 20 belonging to the outer portion facing group 23 is set as the N pole.

In this case, a magnetic field B is generated from the outer portion facing group 23 toward the peripheral portion facing group 22, and the magnetic field intensity becomes maximized between the outer portion facing group 23 and the peripheral portion facing group 22, so that the plasma density between the outer portion facing group 23 and the peripheral portion facing group 22 can be increased.

Figure 3C:
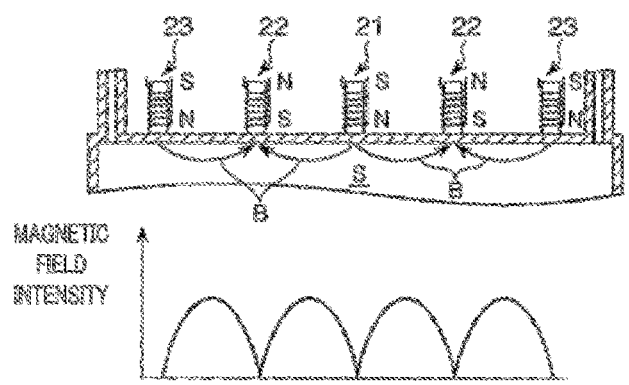
FIG. 3C is a diagram for explaining a relationship between a magnetic pole on a processing space side of each electromagnet and intensity of a magnetic field generated in the processing space.

FIG. 3C illustrates a case where the magnetic pole on the processing space S side of the electromagnet 20 belonging to the central portion facing group 21 is set as the N pole; the magnetic pole on the processing space S side of each electromagnet 20 belonging to the peripheral portion facing group 22 is set as the S pole; and the magnetic pole on the processing space S side of each electromagnet 20 belonging to the outer portion facing group 23 is set as the N pole.

In this case, a magnetic field B is generated from the central portion facing group 21 toward the peripheral portion facing group 22 and also generated from the outer portion facing group 23 toward the peripheral portion facing group 22, and the magnetic field intensity is relatively increased between the central portion facing group 21 and the peripheral portion facing group 22 and between the outer portion facing group 23 and the peripheral portion facing group 22. Accordingly, the plasma density between the central portion facing group 21 and the peripheral portion facing group 22 and between the outer portion facing group 23 and the peripheral portion facing group 22 can be increased.

Figure 4A:
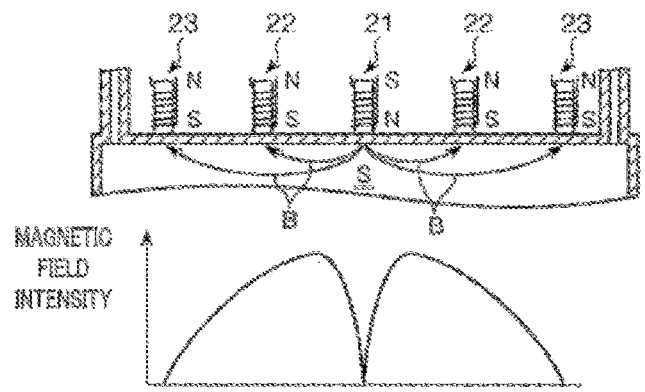
FIG. 4A is a diagram for explaining a relationship between a magnetic pole on a processing space side of each electromagnet and intensity of a magnetic field generated in the processing space.

FIG. 4A illustrates a case where the magnetic pole on the processing space S side of the electromagnet 20 belonging to the central portion facing group 21 is set as the N pole, the magnetic pole on the processing space S side of each electromagnet 20 belonging to the peripheral portion facing group 22 is set as the S pole, and the magnetic pole on the processing space S side of each electromagnet 20 belonging to the outer portion facing group 23 is set as the S pole.

In this case, a magnetic field B is generated from the central portion facing group 21 toward the peripheral portion facing group 22 and the outer portion facing group 23. Further, since the magnetic field B is overlapped between the central portion facing group 21 and the peripheral portion facing group 22, the magnetic field intensity becomes maximized therebetween. Moreover, the magnetic field intensity is relatively increased between the outer portion facing group 23 and the peripheral portion facing group 22. As a result, the plasma density between the central portion facing group 21 and the peripheral portion facing group 22 and between the outer portion facing group 23 and the peripheral portion facing group 22 can be increased. Further, since the plasma density varies depending on the magnetic field intensity, the plasma density between the central portion facing group 21 and the peripheral portion facing group 22 is higher than the plasma density between the outer portion facing group 23 and the peripheral portion facing group 22.

Figure 4B:
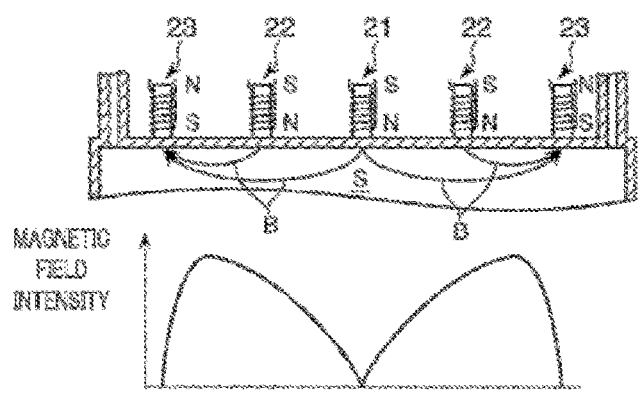
FIG. 4B is a diagram for explaining a relationship between a magnetic pole on a processing space side of each electromagnet and intensity of a magnetic field generated in the processing space.

FIG. 4B illustrates a case where the magnetic pole on the processing space S side of the electromagnet 20 belonging to the central portion facing group 21 is set as the N pole; the magnetic pole on the processing space S side of each electromagnet 20 belonging to the peripheral portion facing group 22 is set as the N pole; and the magnetic pole on the processing space S side of each electromagnet 20 belonging to the outer portion facing group 23 is set as the S pole.

In this case, a magnetic field B is generated from the central portion facing group 21 and the peripheral portion facing group 22 toward the outer portion facing group 23. Further, since the magnetic field B is overlapped between the outer portion facing group 23 and the peripheral portion facing group 22, the magnetic field intensity becomes maximized therebetween. Moreover, the magnetic field intensity is relatively increased between the central portion facing group 21 and the peripheral portion facing group 22. As a result, the plasma density between the central portion facing group 21 and the peripheral portion facing group 22 and between the outer portion facing group 23 and the peripheral portion facing group 22 can be increased. Further, in this case, the plasma density between the outer portion facing group 23 and the peripheral portion facing group 22 is higher than the plasma density between the central portion facing group 21 and the peripheral portion facing group 22.

Figure 4C:
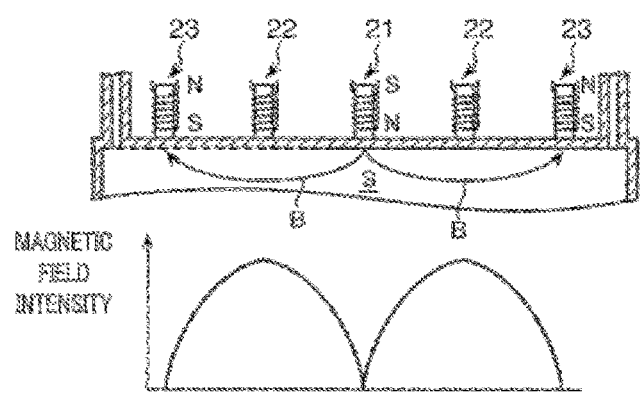
FIG. 4C is a diagram for explaining a relationship between a magnetic pole on a processing space side of each electromagnet and intensity of a magnetic field generated in the processing space.

FIG. 4C illustrates a case where the magnetic pole on the processing space S side of the electromagnet 20 belonging to the central portion facing group 21 is set as the N pole; an electric current is not applied to the coil 20b of each electromagnet 20 belonging to the peripheral portion facing group 22 and the magnetic flux is not generated; and the magnetic pole on the processing space S side of each electromagnet 20 belonging to the outer portion facing group 23 is set as the S pole.

In this case, a magnetic field B is generated from the central portion facing group 21 toward the outer portion facing group 23, and the magnetic field intensity becomes maximized between the central portion facing group 21 and the outer portion facing group 23, specifically at a location facing the peripheral portion facing group 22. As a result, the plasma density at the location facing the peripheral portion facing group 22 can be increased.

The substrate processing apparatus 10 in accordance with the present example embodiment includes the multiple electromagnets 20 arranged in a substantially radial shape on the top surface 13a of the upper electrode 13 opposite to the processing space S. Therefore, a magnetic field B radially distributed with respect to the central portion of the wafer W in the processing space can be generated. Further, by varying a direction or a magnitude of an electric current flowing in each electromagnet 20, it is possible to easily control a magnetic flux density or a magnetic flux direction of a magnetic field to be generated. As a result, it is possible to obtain a magnetic field distribution that allows a plasma density distribution in the processing space to be optimized.

A plasma density distribution in the processing space S varies depending on conditions of a plasma process, for example, a kind of a processing gas, or a power and a frequency of a high frequency power. However, with the substrate processing apparatus 10, it is possible to obtain a plasma density distribution as desired. By way of example, in order to obtain a uniform plasma density distribution in the processing space S, if a plasma density distribution generated only by an electric field E is increased at a central portion of the processing space S, as depicted in FIG. 3B and FIG. 4B, it is necessary to increase the plasma density between the outer portion facing group 23 and the peripheral portion facing group 22 by maximizing the magnetic field intensity between the outer portion facing group 23 and the peripheral portion facing group 22. Thus, the plasma density distribution (dense at the central portion of the processing space S) generated only by the electric field E is overlapped with the plasma density distribution (dense at the peripheral portion of the processing space S) generated by the magnetic field B, so that a uniform plasma density distribution can be obtained.

Further, if a plasma density distribution generated only by the electric field E is increased at the peripheral portion of the processing space S, as depicted in FIG. 3A and FIG. 4A, it is necessary to increase the plasma density between the central portion facing group 21 and the peripheral portion facing group 22 by maximizing the magnetic field intensity between the central portion facing group 21 and the peripheral portion facing group 22. Thus, the plasma density distribution (dense at the peripheral portion of the processing space S) generated only by the electric field E is overlapped with the plasma density distribution (dense at the central portion of the processing space S) generated by the magnetic field B, so that a uniform plasma density distribution can be obtained.

That is, in the substrate processing apparatus 10, intensity of a magnetic field generated by each electromagnet 20 and/or a magnetic pole of each electromagnet 20 may be varied depending on the conditions of the plasma process to be performed on the wafer W. Therefore, if these conditions of the plasma process to be performed on the wafer W are changed, it is possible to obtain plasma density distributions respectively optimized for the conditions of the plasma process before and after the conditions are changed by controlling the generation condition of the magnetic field B.

Hereinafter, a substrate processing apparatus in accordance with a second example embodiment will be explained.

Configurations and operations of the present example embodiment are basically the same as those of the above-described first example embodiment, so that explanation of the redundant configurations and operations will be omitted and different configurations and operations will be explained below.

Figure 5:
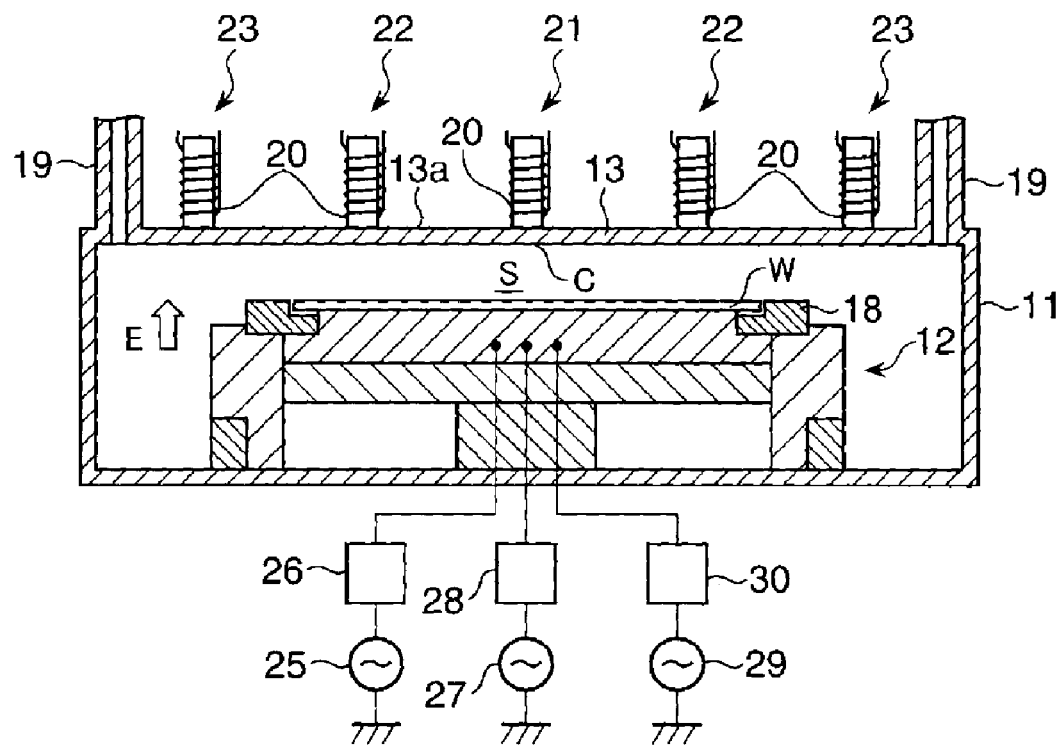
FIG. 5 is a cross-sectional view schematically showing a configuration of a substrate processing apparatus in accordance with a second example embodiment.

FIG. 5 is a cross-sectional view schematically showing a configuration of a substrate processing apparatus in accordance with the present example embodiment.

A substrate processing apparatus 24 in FIG. 5 includes three high frequency power supplies configured to apply high frequency powers. To be specific, the susceptor 12 is connected to a first high frequency power supply 25 via a first matching unit 26, to a second high frequency power supply 27 via a second matching unit 28, and to a third high frequency power supply 29 via a third matching unit 30. The first high frequency power supply 25 is configured to apply a high frequency power of, for example, about 40 MHz to the susceptor 12, the second high frequency power supply 27 is configured to apply a high frequency power of, for example, about 100 MHz to the susceptor 12, and the third high frequency power supply 29 is configured to apply a high frequency power of, for example, about 3.2 MHz to the susceptor 12.

In the substrate processing apparatus 24, the high frequency powers are applied from the first high frequency power supply 25, the second high frequency power supply 27, and the third high frequency power supply 29 to the susceptor 12 depending on conditions of a plasma process. Further, the high frequency powers need not be applied to the susceptor 12 from all of the three high frequency power supplies 25, 27, and 29, and for example, a high frequency power may be applied from one or two selected from the three high frequency power supplies 25, 27, and 29. Although in the present example embodiment, the three high frequency power supplies 25, 27, and 29 are connected to the susceptor 12, four or more high frequency power supplies may be connected to the susceptor 12. Further, the high frequency power supply may not be connected to the susceptor 12, but the high frequency power supply may be connected to the upper electrode to apply the high frequency power to the processing space S.

However, as described in, for example, Japanese Patent Laid-open Publication No. 2007-266533, when high-density plasma is generated under a low pressure by applying a high frequency power to a lower electrode such as a susceptor, if a frequency of the high frequency power is increased in order to meet a recent demand for process miniaturization, a high frequency current generated by the high frequency power is concentrated on a central portion of the upper electrode or a central portion of the lower electrode. Thus, the plasma density generated in a processing space is increased at a central portion of the processing space rather than a peripheral portion of the processing space. As a result, an attention has been drawn to a decrease of in-plane uniformity in a plasma process to be performed on a wafer W.

In the present example embodiment, in order to solve a non-uniform plasma density distribution generated when the frequencies of the high frequency powers applied from the high frequency power supplies are increased, intensity of a magnetic field to be generated by controlling each electromagnet 20 depending on the frequencies of the high frequency powers to be applied to the susceptor 12 and/or a magnetic pole of the electromagnet 20 is changed.

By way of example, if the second high frequency power 27 applies a high frequency power of about 100 MHz to the susceptor 12, a plasma density distribution dense at a central portion of the processing space S is generated. However, in order to remove this non-uniformity, for example, as depicted in FIG. 3B and FIG. 4B, the magnetic pole on the processing space S side of each electromagnet 20 belonging to the peripheral portion facing group 22 is set as the S pole and the magnetic pole on the processing space S side of each electromagnet 20 belonging to the outer portion facing group 23 is set as the N pole, or the magnetic pole on the processing space S side of the electromagnet 20 belonging to the central portion facing group 21 is set as the N pole, the magnetic pole on the processing space S side of each electromagnet 20 belonging to the peripheral portion facing group 22 is set as the N pole, and the magnetic pole on the processing space S side of each electromagnet 20 belonging to the outer portion facing group 23 is set as the S pole. Thus, it is possible to generate a magnetic field B of which intensity is maximized between the outer portion facing group 23 and the peripheral portion facing group 22, and it is possible to generate a plasma density distribution dense at a peripheral portion of the processing space S can be generated by the magnetic field B.

As a result, the plasma density distribution dense at the central portion of the processing space S can be overlapped with the plasma density distribution dense at the peripheral portion thereof, so that a uniform plasma density distribution in the processing space S can be obtained.

If the first high frequency power supply 25 applies a high frequency power of about 40 MHz to the susceptor 12, a relatively uniform plasma density distribution is generated in the processing space S. Thus, in order not to disperse this plasma density distribution by the magnetic field B, an electric current is not applied to the coils 20b of all the electromagnets 20 belonging to the central portion facing group 21, the peripheral portion facing group 22, and the outer portion facing group 23, and a magnetic field B is not generated.

In the substrate processing apparatus 24 in accordance with the present example embodiment, if the second high frequency power supply 27 applies a high frequency power of about 100 MHz to the susceptor 12, the magnetic field B of which intensity is maximized between the outer portion facing group 23 and the peripheral portion facing group 22 is generated, and if the first high frequency power supply 25 applies a high frequency power of about 40 MHz to the susceptor 12, an electric current is not applied to the coils 20b of all the electromagnets 20 and the magnetic field B is not generated. Therefore, regardless of a frequency of a high frequency power to be applied to the susceptor 12, a uniform plasma density distribution in the processing space S can be obtained, so that it is possible to suppress in-plane uniformity of the wafer W from being decreased in the plasma process.

Although the third high frequency power supply 29 applies a high frequency power of about 3.2 MHz to the susceptor 12 in the above-described substrate processing apparatus 24, the third high frequency power supply 29 may apply a high frequency power of about 13 MHz to the susceptor 12.

Hereinafter, a substrate processing apparatus in accordance with a third example embodiment will be explained Configurations and operations of the present example embodiment are basically the same as those of the above-described first example embodiment, so that explanation of the redundant configurations and operations will be omitted and different configurations and operations will be explained below.

FIG. 6A to FIG. 6C and FIG. 7A to FIG. 7C are process diagrams for explaining a TSV (Through Silicon Via) process a part of which is performed by the substrate processing apparatus in accordance with the present example embodiment. The TSV process is a processing method of obtaining a three-dimensional wiring structure by forming a through via in a silicon layer of a chip, in order to obtain an electric connection between chips stacked for manufacturing a semiconductor device.

Figure 6A:
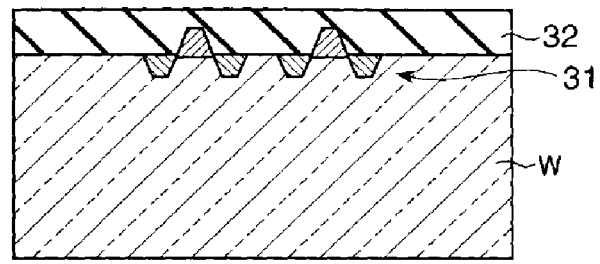
FIG. 6A is a process diagram for explaining a TSV process a part of which is performed by the substrate processing apparatus in accordance with the present example embodiment.

First, a transistor 31 is formed on a surface of a wafer W, and on the wafer W on which the transistor 31 is formed, an interlayer insulating film 32 is further formed (FIG. 6A).

Figure 6B:
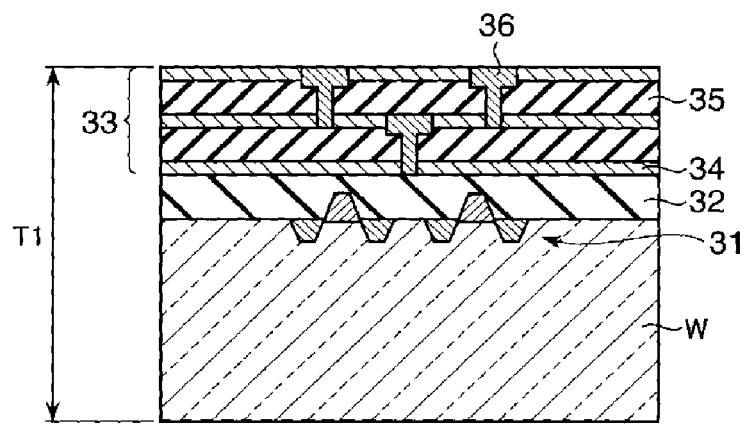
FIG. 6B is a process diagram for explaining the TSV process a part of which is performed by the substrate processing apparatus in accordance with the present example embodiment.

Then, a wiring structure 33 is formed on the interlayer insulating film 32. In this wiring structure 33, multiple wiring layers 34 and multiple insulating films 35 are alternately stacked on the interlayer insulating film 32, and via holes 36 for wiring, through which the upper and lower wiring layers 34 are electrically connected to each other, are formed to be penetrated through the insulating film 35 (FIG. 6B).

Figure 6C:
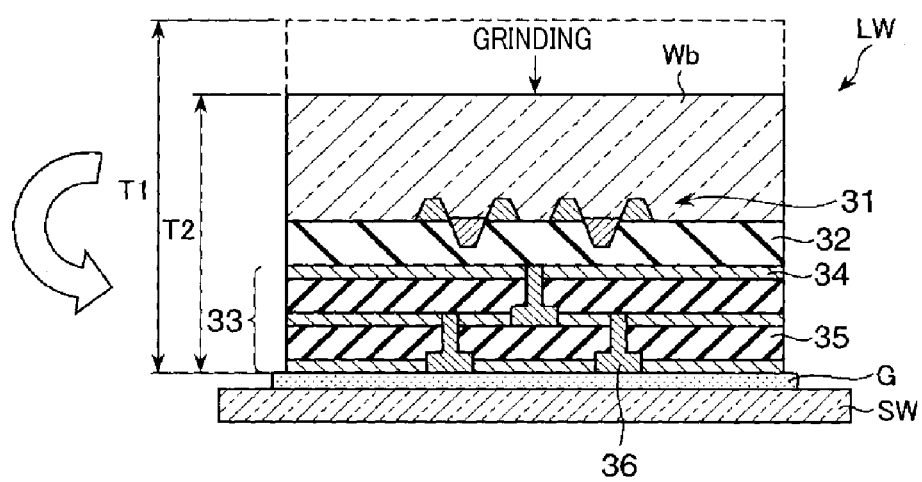
FIG. 6C is a process diagram for explaining the TSV process a part of which is performed by the substrate processing apparatus in accordance with the present example embodiment.

Thereafter, the wafer W is turned over and bonded to a support wafer SW with a photoreactive adhesive G, so that a bonded wafer LW is formed. The support wafer SW is a substrata serving as a supporting body configured to reinforce the wafer W and suppress the wafer W from being bent when the wafer W becomes thinned by grinding a rear surface Wb of the wafer W. Further, the support wafer SW is formed of a silicon plate or quartz glass having a thickness of, for example, about 10 μm. Further, the bonded wafer LW is supported by, for example, a support provided in a grinding device, and the rear surface Wb of the wafer W is ground until a thickness T1 before the grinding is reduced to a certain thickness T2 of, for example, about 50 μm to about 200 μm (FIG. 6C).

Figure 7A:
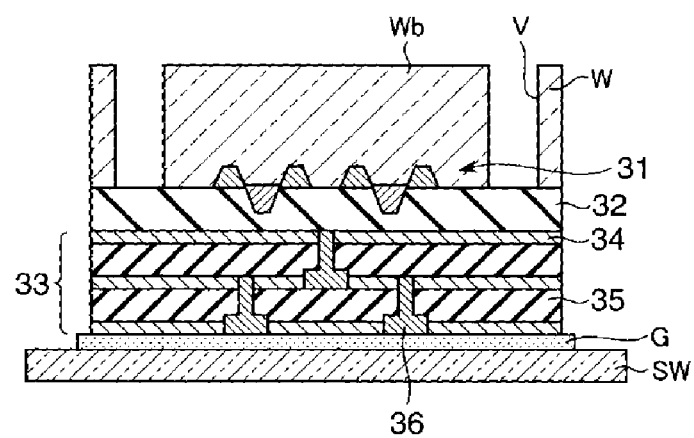
FIG. 7A is a process diagram for explaining the TSV process a part of which is performed by the substrate processing apparatus in accordance with the present example embodiment.

Then, the rear surface Wb of the wafer W is coated with a resist (not illustrated) and then exposed and developed, so that a resist pattern (not illustrated) for forming a via hole is formed. A dry etching process is performed on the bonded wafer LW by a substrate processing apparatus 39 to be described later and a via hole V having a diameter of, for example, about 1 μm to about 10 μm is formed. The resist remaining on the rear surface Wb of the bonded wafer LW is removed through an ashing process performed by the substrate processing apparatus 39 to be described later (FIG. 7A). Further, a depth of the via hole V corresponds to a thickness of the wafer W after the rear surface Wb of the wafer W becomes thinned by the grinding, and is, for example, about 50 μm to about 200 μm.

Figure 7B:
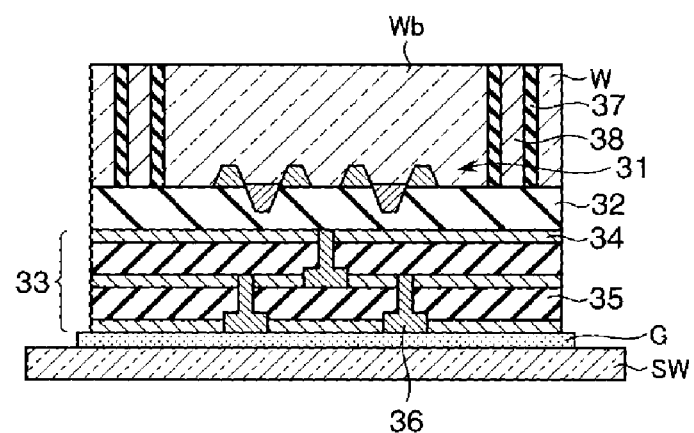
FIG. 7B is a process diagram for explaining the TSV process a part of which is performed by the substrate processing apparatus in accordance with the present example embodiment.

Thereafter, on an inner peripheral surface of the via hole V, an insulating film 37 formed of, for example, polyimide is formed. Within the via hole V of which the inner peripheral surface is coated with the insulating film 37, a through electrode 38 is formed by, for example, the electroplating (FIG. 7B).

Figure 7C:
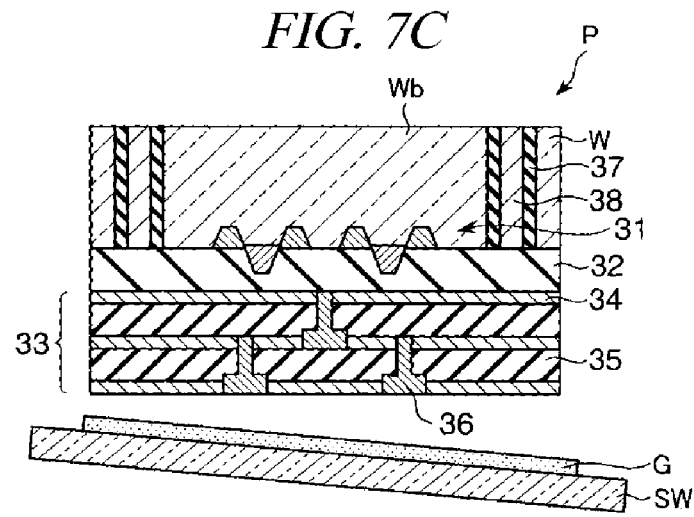
FIG. 7C is a process diagram for explaining the TSV process a part of which is performed by the substrate processing apparatus in accordance with the present example embodiment.

Then, an adhesive strength of the adhesive G is reduced by irradiating, for example, ultraviolet lights (UV light), and the support wafer SW is separated from the wafer W. Thus, it is possible to obtain a chip P formed of the wafer W which becomes thinned and has the through electrode 38 therein (FIG. 7C).

Figure 8A:
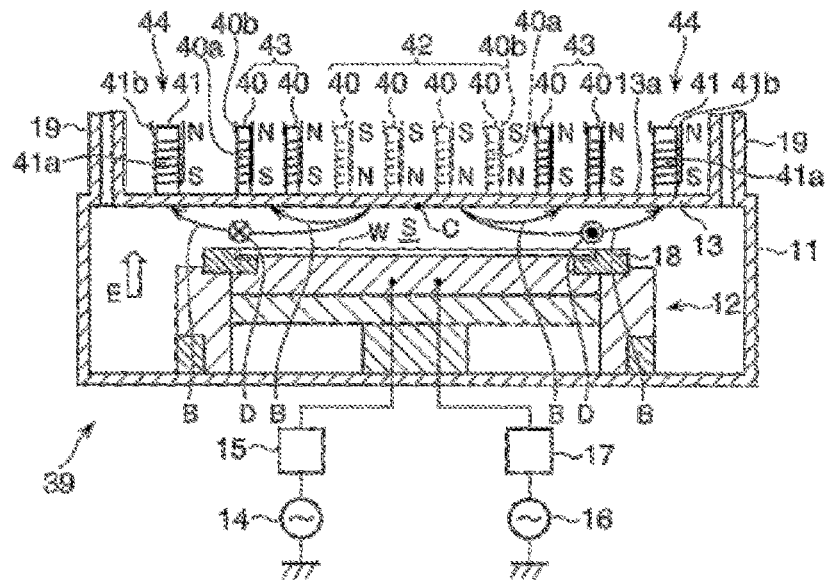
FIG. 8A is a cross-sectional view schematically showing a configuration of a substrate processing apparatus in accordance with a third example embodiment.
Figure 8B:
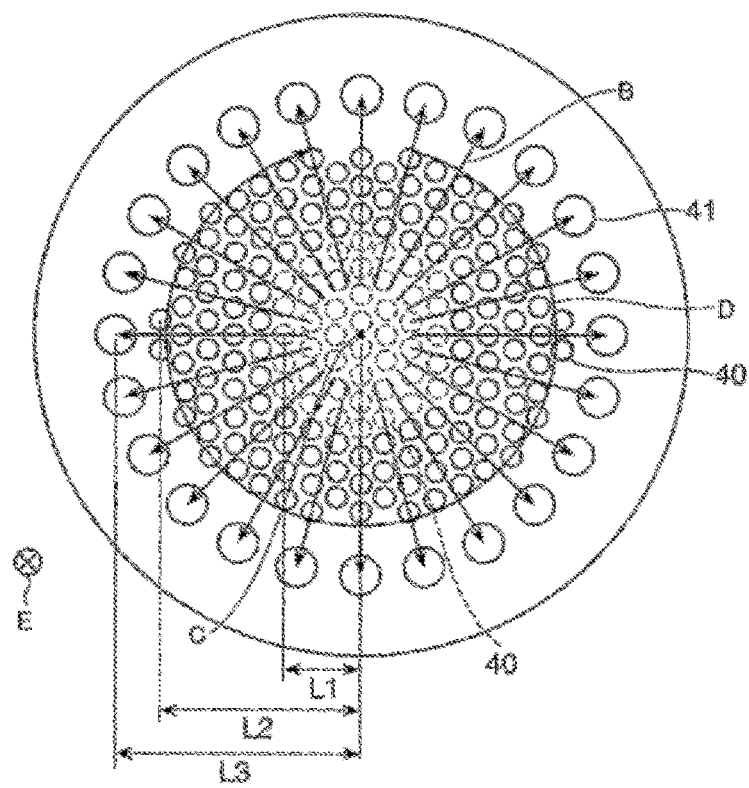
FIG. 8B is a cross-sectional view schematically showing a configuration of the substrate processing apparatus in accordance with the third example embodiment, and shows an upper electrode of the substrate processing apparatus when viewed along a white arrow of FIG. 8A.

FIG. 8A and FIG. 8B are diagrams schematically showing a configuration of a substrate processing apparatus in accordance with the present example embodiment, specifically, FIG. 8A is a cross-sectional view, and FIG. 8B is a diagram showing an upper electrode of the substrate processing apparatus when viewed along a white arrow of FIG. 8A. The present substrate processing apparatus is configured to perform a plasma process, for example, a dry etching process or an ashing process in the TSV process as shown in FIG. 6A to FIG. 6C and FIG. 7A to FIG. 7C, on the wafer.

In FIG. 8A, the substrate processing apparatus 39 includes two kinds of multiple electromagnets 40 and electromagnets 41 arranged on the top surface 13a of the upper electrode 13. Each electromagnet 40 includes a rod-shaped yoke 40a and a coil 40b wound on a side surface of the yoke 40a. Like the electromagnet 40, each electromagnet 41 also includes a rod-shaped yoke 41a and a coil 41b wound on a side surface of the yoke 41a.

In the electromagnet 40, the yoke 40a is formed of an iron core having a diameter of about 6.5 mm to about 7.5 mm, and the coil 40b is formed by winding a copper wire on the side surface of the yoke 40a about 180 times to about 200 times. Further, in the electromagnet 41, the yoke 41a is formed of an iron core having a diameter of about 26 mm to about 28 mm, and the coil 41b is formed by winding a copper wire on the side surface of the yoke 41a about 1300 times to about 1500 times.

In the electromagnet 40 or the electromagnet 41, by controlling a value of an electric current or a direction of an electric current flowing in the coil 40b or the coil 41b, it is possible to change the total magnetic flux or a direction of the magnetic flux generated by the electromagnet 40 or the electromagnet 41.

Generally, the total magnetic flux generated by an electromagnet can be expressed by the following equation (2).

Total magnetic flux=magnetomotive force/magnetic reluctance (2)

The total magnetic flux refers to an amount of all magnetic force lines generated from one ends of yokes as iron cores, and the unit thereof is Wb (weber). The magnetomotive force refers to a force for generating magnetic flux in a so-called magnetic circuit, and the unit thereof is AT (ampere turn). Specifically, the magnetomotive force is expressed by the product of the number of coil windings on a yoke and a value of the electric current flowing in the coil. Therefore, as the coil winding number and the value of the electric current flowing in the coil are both increased, the magnetomotive force is also increased. The magnetic reluctance is an index indicating the difficulty of the magnetic flux flow in the magnetic circuit, which is expressed by the following equation (3).

Magnetic reluctance=length of magnetic path/(magnetic permeability×cross sectional area of magnetic path) (3)

The length of the magnetic path is the length of the yoke, the magnetic permeability is a permeability of the yoke, and the cross sectional area of the magnetic path is a cross sectional area of the yoke. Therefore, as the length of the yoke is increased and the diameter of the yoke is decreased, the magnetic reluctance is increased.

In the electromagnets 40 and 41, the yokes 40a and 41a have the same length and the same permeability. The values of the electric currents flowing in the coils 40b and 41b are substantially the same (electric current of about 0.78 A flows in the coil 40b at a peak, and the electric current of about 0.70 A flows in the coil 41b at a peak). Since, however, the winding number of the coil 41b is greater than that of the coil 40b, the magnetomotive force of the electromagnet 41 is greater than that of the electromagnet 40. Further, a diameter of the yoke 41 is greater than that of the yoke 40, so that the magnetic reluctance of the electromagnet 41 becomes smaller than that of the electromagnet 40. Accordingly, the total magnetic flux generated by the electromagnets 41 becomes greater than that generated by the electromagnets 40. To be specific, the total magnetic flux generated by the electromagnets 41 becomes about 8 to about 12 times greater than that generated by the electromagnets 40.

In the substrate processing apparatus 39, as shown in FIG. 8B, the electromagnets 40 and 41 are divided into a central portion facing group 42 (first electromagnet group) including the multiple electromagnets 40 facing the central portion of the wafer W; a peripheral portion facing group 43 (second electromagnet group) including the multiple electromagnets 40 arranged to surround the central portion facing group 42; and an outer portion facing group 44 (third electromagnet group) including the multiple electromagnets 41 which are arranged in a circular ring shape with respect to the upper electrode central portion C and also arranged at an outside of the peripheral portion facing group 43 without facing the wafer W. In the central portion facing group 42 and the peripheral portion facing group 43, the electromagnets 40 are spaced apart at equal distances in a radial direction and a circumferential direction of the upper electrode 13 and also arranged in a substantially radial shape. Further, in the outer portion facing group 44, the electromagnets 41 are arranged in a single annular ring shape along the circumferential direction of the upper electrode 13. Furthermore, in FIG. 8A and FIG. 8B, the electromagnets 40 of the central portion facing group 42 are indicated by dashed lines.

The central portion facing group 42 includes the multiple electromagnets 40 of which central portions are spaced from the upper electrode central portion C by a distance of about 74.4 mm or less (indicated by L1 in FIG. 8B). Further, the peripheral portion facing group 43 includes the multiple electromagnets 40 of which central portions are spaced from the upper electrode central portion C by a distance greater than about 74.4 mm and equal to or smaller than about 148.8 mm (indicated by L2 in FIG. 8B). Moreover, the outer portion facing group 44 includes the multiple electromagnets 41 of which central portions are spaced from the upper electrode central portion C by a distance of about 190 mm (indicated by L3 in FIG. 8B).

In the central portion facing group 42 and the peripheral portion facing group 43, the directions of the electric currents flowing in the coils 40b of the electromagnets 40 are set such that magnetic poles on the processing space S side of the electromagnets 40 have the same polarity. In the outer portion facing group 44, the directions of the electric currents flowing in the coils 41b of the electromagnets 41 are set such that the magnetic poles on the processing space S side of the electromagnets 41 have the same polarity.

Figure 9A:
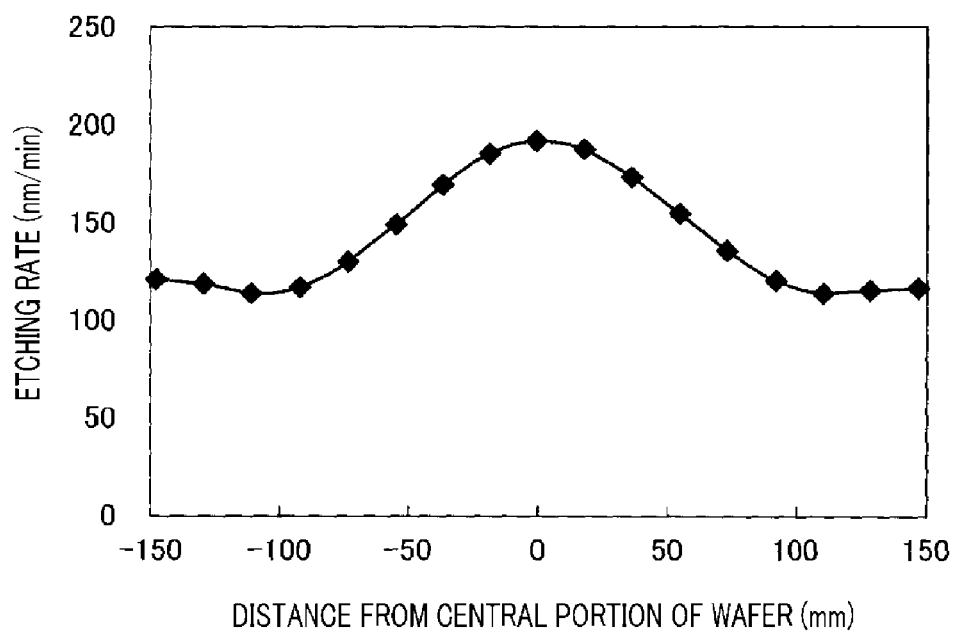
FIG. 9A is a graph showing an etching rate when the substrate processing apparatus of FIG. 8A and FIG. 8B performs an etching process on a wafer, and shows a case where a magnetic field is not generated within a processing space.

However, in a case where a mixed gas of a fluorine-containing gas and an oxygen gas, for example, a mixed gas containing a $SF_6$ gas and an $O_2$ gas is used as a processing gas and the TSV process is performed on the wafer W by generating plasma from the processing gas, it is known that plasma density at a central portion of the processing space S becomes higher than plasma density at a peripheral portion of the processing space S, so that an etching rate at a central portion of the wafer W becomes higher than an etching rate at a peripheral portion of the wafer W, as shown in the graph of FIG. 9A.

In the substrate processing apparatus 39 in accordance with the present example embodiment, in order to remove this non-uniformity, the magnetic pole on the processing space S side of each electromagnet 40 belonging to the central portion facing group 42 is set as the N pole, and the magnetic pole on the processing space S side of each electromagnet 40 belonging to the peripheral portion facing group 43 and the magnetic pole on the processing space S side of each electromagnet 41 belonging to the outer portion facing group 44 are set as the S poles.

In this case, as depicted in FIG. 8A and FIG. 8B, a magnetic field B is radially generated from the central portion facing group 42 toward the peripheral portion facing group 43 and the outer portion facing group 44. In the generated magnetic field B, the total magnetic flux generated by the electromagnets 41 belonging to the outer portion facing group 44 is greater than the total magnetic flux generated by the electromagnets 40 belonging to the central portion facing group 42 and the peripheral portion facing group 43 as described above. As a result, the magnetic field intensity at the peripheral portion of the processing space S is greater than the magnetic field intensity at the central portion of the processing space S. Therefore, in the magnetic field B, the magnetic field intensity near the outer portion facing group 44, i.e. the peripheral portion of the processing space S, is maximized (see FIG. 10B to be described later).

In this case, from a front side of FIG. 8B toward an inner side thereof, an electric field E has been generated by applying a high frequency power from the first high frequency power supply 14 to the susceptor 12. Thus, electrons are rotated around the upper electrode central portion C along a circular electron trajectory D according to the Fleming's left-hand rule. Since, however, the magnetic field density at the peripheral portion of the processing space S is maximized, many electrons are rotated at the peripheral portion of the processing space S, so that a lot of plasma is generated at the peripheral portion of the processing space S and the plasma density is increased. Thus, a plasma density distribution (dense at the central portion of the processing space S) generated by the etching process is overlapped with a plasma density distribution (dense at the peripheral portion of the processing space S) caused by the magnetic field B generated by the substrate processing apparatus 39 to obtain a uniform plasma density distribution.

Figure 9B:
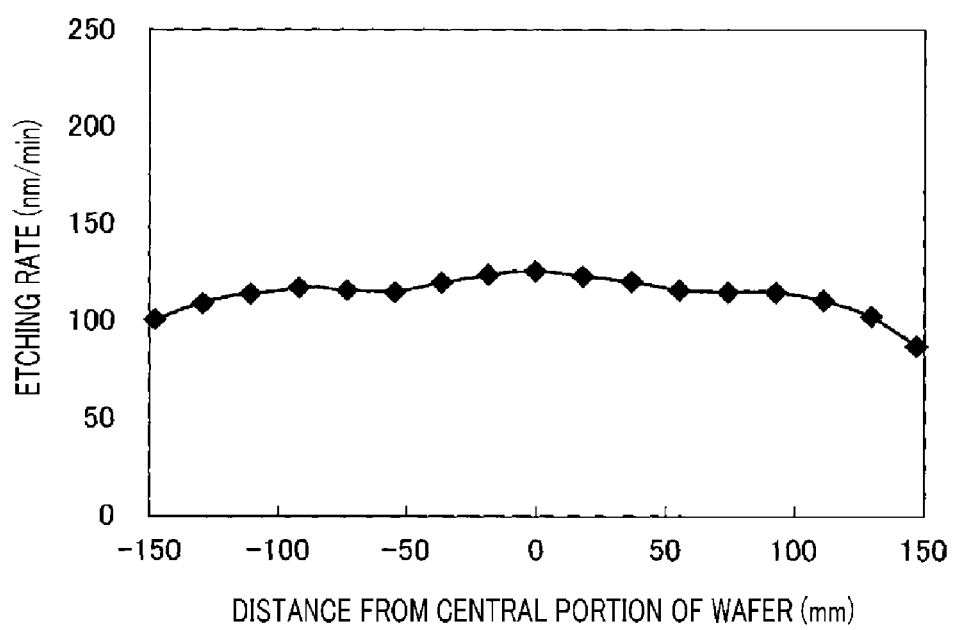
FIG. 9B is a graph showing an etching rate when the substrate processing apparatus of FIG. 8A and FIG. 8B performs the etching process on the wafer, and shows a case where a magnetic field in a radial shape is generated within the processing space.

FIG. 9B is a graph showing an etching rate distribution when the substrate processing apparatus 39 depicted in FIG. 8A and FIG. 8B performs an etching process on the wafer W while generating the magnetic field B.

As shown in the graph of FIG. 9B, when performing the etching process, if the substrate processing apparatus 39 sets the magnetic pole on the processing space S side of each electromagnet 40 belonging to the central portion facing group 42 as the N pole, and sets the magnetic pole on the processing space S side of each electromagnet 40 belonging to the peripheral portion facing group 43 and the magnetic pole on the processing space S side of each electromagnet 41 belonging to the outer portion facing group 44 as the S poles, and then, generates a magnetic field B, a substantially uniform etching rate can be obtained in the entire surface of the wafer W.

Figure 10A:
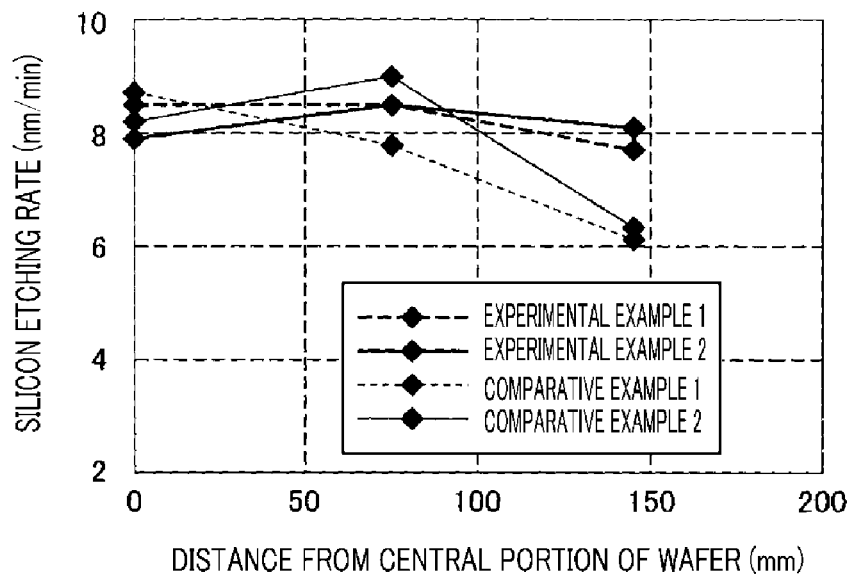
FIG. 10A is a graph explaining a calculation result when a magnetic pole on a processing space side of each electromagnet is changed in a central portion facing group, a peripheral portion facing group, and an outer portion facing group in the substrate processing apparatus of FIG. 8A and FIG. 8B, and shows an etching rate distribution.
Figure 10B:
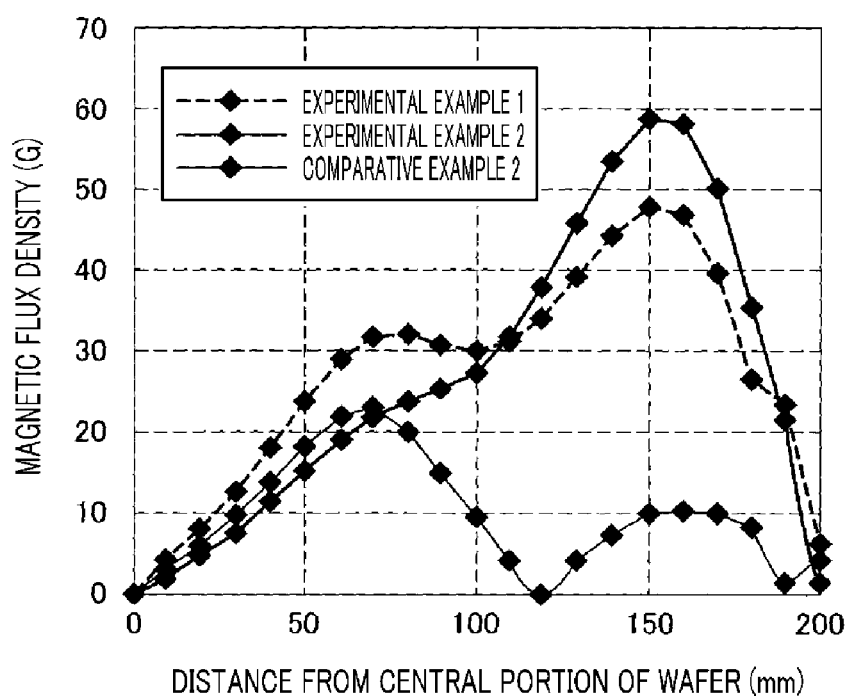
FIG. 10B is a graph explaining a calculation result when the magnetic pole on the processing space side of each electromagnet is changed in the central portion facing group, the peripheral portion facing group, and the outer portion facing group in the substrate processing apparatus of FIG. 8A and FIG. 8B and shows a magnetic flux density distribution.
Figure 11:
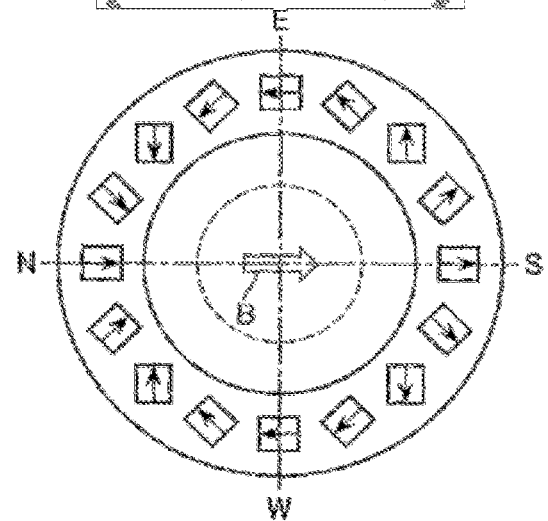
FIG. 11 is a diagram showing a horizontal magnetic field in a conventional magnetron plasma processing apparatus.
Figure 12:
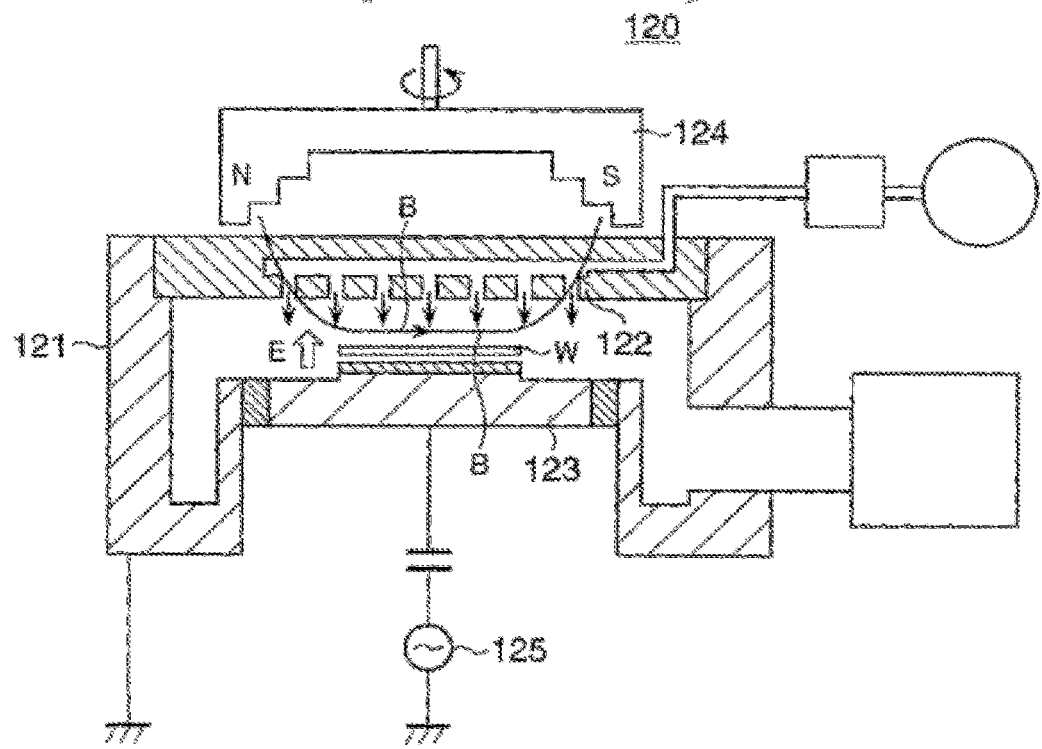
FIG. 12 is a cross-sectional view schematically showing a configuration of a conventional magnetron plasma etching apparatus.
Figure 13:
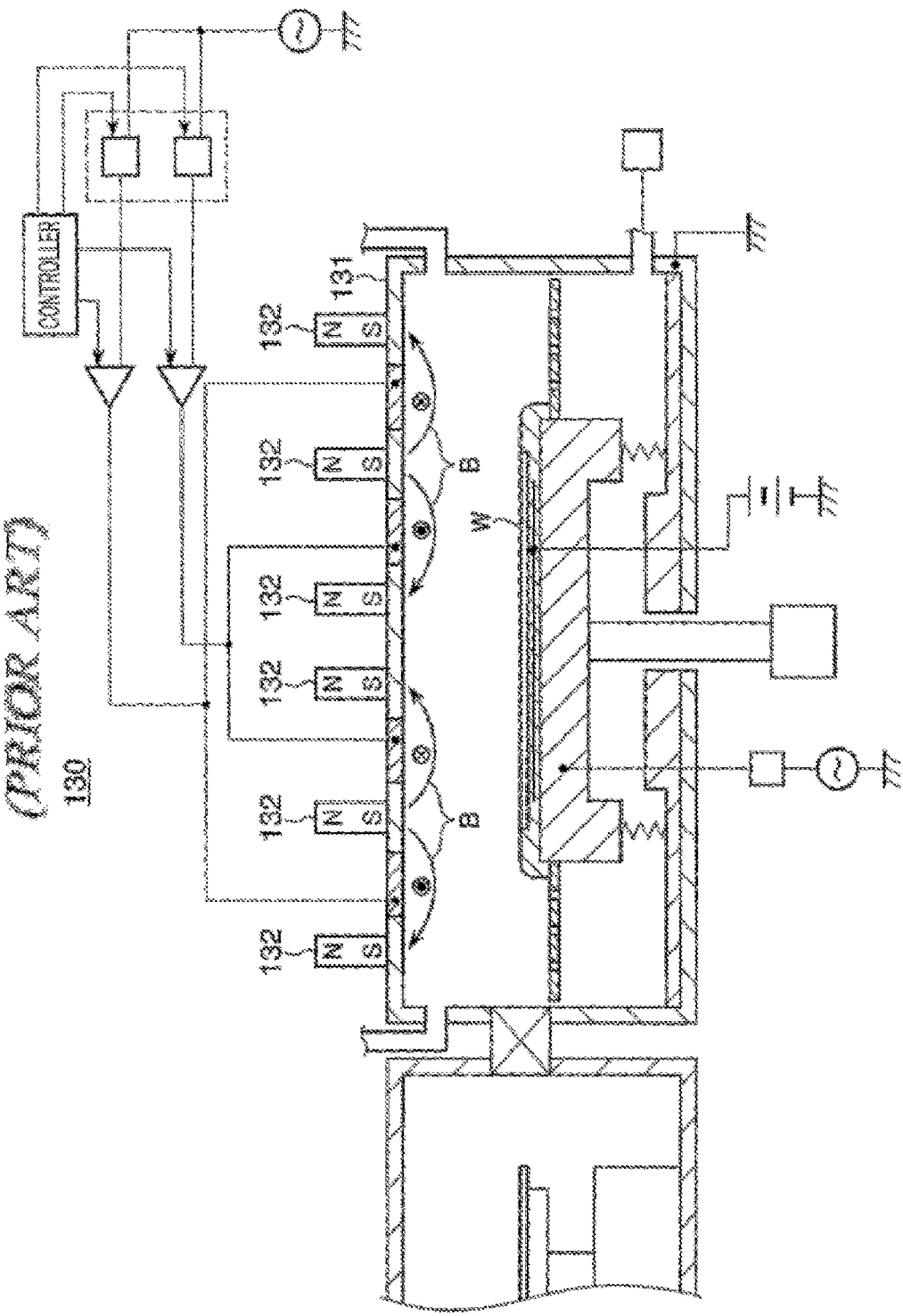
FIG. 13 is a cross-sectional view schematically showing a configuration of a conventional plasma processing apparatus that removes the non-uniformity in plasma density.

FIG. 10A and FIG. 10B are graphs for explaining a calculation result when a magnetic pole on the processing space S side of each electromagnet 40 and electromagnet 41 is changed in the central portion facing group 42, the peripheral portion facing group 43, and the outer portion facing group 44 in the substrate processing apparatus 39, and FIG. 10A shows an etching rate distribution, and FIG. 10B shows a magnetic flux density distribution.

A thin dashed line indicates a case where all the electromagnets 40 and all the electromagnets 41 do not generate magnetic flux (comparative comparative 1). A thin solid line indicates a case where the magnetic pole on the processing space S side of each electromagnet 40 belonging to the central portion facing group 42 is set as the N pole, the magnetic pole on the processing space S side of each electromagnet 40 belonging to the peripheral portion facing group 43 is set as the S pole, and each electromagnet 41 belonging to the outer portion facing group 44 does not generate magnetic flux (comparative comparative 2). A thick dashed line indicates a case where the magnetic pole on the processing space S side of each electromagnet 40 belonging to the central portion facing group 42 is set as the N pole, each electromagnet 40 belonging to the peripheral portion facing group 43 does not generate magnetic flux, and the magnetic pole on the processing space S side of each electromagnet 41 belonging to the outer portion facing group 44 is set as the S pole (experimental example 1). A thick solid line indicates a case where the magnetic pole on the processing space S side of each electromagnet 40 belonging to the central portion facing group 42 is set as the N pole, the magnetic pole on the processing space S side of each electromagnet 40 belonging to the peripheral portion facing group 43 is set as the S pole, and the magnetic pole on the processing space S side of each electromagnet 41 belonging to the outer portion facing group 44 is set as the S pole (experimental example 2).

It can be seen from the experimental example 1 and the experimental example 2 shown in the graph of FIG. 10B, if the magnetic pole on the processing space S side of each electromagnet 40 belonging to the central portion facing group 42 is set as the N pole and the magnetic pole on the processing space S side of each electromagnet 41 belonging to the outer portion facing group 44 is set as the S pole, it is possible to obtain a magnetic field B in which the magnetic field intensity (indicated as the magnetic flux density in this graph) is maximized at the peripheral portion of the processing space S, specifically, at a slightly outside of the wafer W in a range of about 150 mm to about 160 mm from the central portion of the wafer W.

Further, as shown in the experimental example 1 and the experimental example 2, the etching rate on the entire surface of the wafer W is substantially uniform. It is assumed that this is because the outer portion facing group 44 is provided at a place where the outer portion facing group 44 does not face the wafer W, specifically, at an outside of the wafer W. Accordingly, a magnetic field B having the maximum magnetic field intensity at a slightly outside of the wafer W can be obtained and the plasma density can be substantially uniform throughout the entire area facing the wafer W in the processing space S.

Furthermore, in the experimental example 2, the magnetic field intensity is not smoothly increased from the central portion of the processing space S (central portion of the wafer W) to the peripheral portion of the processing space S (in a range of about 150 mm to about 160 mm from the central portion of the wafer W), and particularly, forms a step-shaped portion at an area (in a range of about 70 mm to about 100 mm from the central portion of the wafer W) facing the peripheral portion facing group 43. It is assumed that this is because the magnetic pole on the processing space S side of each electromagnet 40 belonging to the peripheral portion facing group 43 and the magnetic pole on the processing space S side of each electromagnet 41 belonging to the outer portion facing group 44 have the same polarity S, and the magnetic flux generated by each electromagnet 40 belonging to the peripheral portion facing group 43 and the magnetic flux generated by each electromagnet 41 belonging to the outer portion facing group 44 offset each other.

In the substrate processing apparatus 39 in accordance with the present example embodiment, the two kinds of multiple electromagnets 40 and multiple electromagnets 41 arranged on the top surface 13a of the upper electrode 13 are divided into the central portion facing group 42 facing the central portion of the wafer W; the peripheral portion facing group 43 configured to surround the central portion facing group 42; and the outer portion facing group 44 which is arranged on the outside of the peripheral portion facing group 43 without facing the wafer W. Further, the magnetic field B in which the magnetic field intensity at the peripheral portion of the processing space S is greater than the magnetic field intensity at the central portion of the processing space S is generated. Thus, it is possible to improve a plasma density distribution in which the plasma density generated by the TSV process is higher at the central portion of the processing space S than at the peripheral portion of the processing space S.

In the above-described substrate processing apparatus 39, the magnetic pole on the processing space S side of each electromagnet 40 belonging to the central portion facing group 42 is set as the N pole and the magnetic pole on the processing space S side of each electromagnet 41 belonging to the outer portion facing group 44 is set as the S pole. However, it is possible to generate the magnetic field B in which the magnetic field intensity at the peripheral portion of the processing space S is greater than magnetic field intensity at the central portion of the processing space S as long as the magnetic pole on the processing space S side of each electromagnet 40 belonging to the central portion facing group 42 and the magnetic pole on the processing space S side of each electromagnet 41 belonging to the outer portion facing group 44 are opposite to each other. Therefore, the magnetic pole on the processing space S side of each electromagnet 40 belonging to the central portion facing group 42 may be set as the S pole and the magnetic pole on the processing space S side of each electromagnet 41 belonging to the outer portion facing group 44 may be set as the N pole.

In the above-described substrate processing apparatus 39, in order to correspond to an inflection point of the etching rate positioned near about 75 mm from the central portion of the wafer W as shown in the graph of FIG. 9A, the central portion facing group 42 includes the electromagnets 40 of which central portions are spaced from the upper electrode central portion C by a distance of about 74.4 mm or less, and the peripheral portion facing group 43 includes the electromagnets 40 of which central portions are spaced from the electrode central portion C by a distance greater than about 74.4 mm. That is, the boundary of the central portion facing group 42 and the peripheral portion facing group 43 is set to be about 74.4 mm from the electrode central portion C. However, the boundary of the central portion facing group 42 and the peripheral portion facing group 43 can be changed to obtain the distribution of the magnetic field B that allows the plasma density distribution in the processing space S to be optimized.

Further, the multiple electromagnets 40 do not need to be divided into the central portion facing group 42 and the peripheral portion facing group 43. In order to obtain a uniform plasma density distribution by overlapping the plasma density distribution generated by the etching process with the plasma density distribution generated by the magnetic field B, it is possible to divide the multiple electromagnets 40 into one or three or more electromagnet groups and also possible to obtain a distribution of the magnetic field B that allows the plasma density distribution in the processing space S to be optimized.

Furthermore, the boundary of the central portion facing group 42 and the peripheral portion facing group 43 or the number of electromagnet groups can be changed by intensity of the magnetic field B generated by each electromagnet 40 by controlling the value or the direction of the electric current flowing in the coil 40b of each electromagnet 40 through the controller and/or by controlling the magnetic pole of each electromagnet 40.

Although the present disclosure has been explained with reference to the example embodiments above, the present disclosure is not limited to each of the example embodiments.

The present patent application claims the benefit of priority to Japanese Patent Application No. 2012-008019 filed on Jan. 18, 2012 and incorporated herein by reference in its entirety.

EXPLANATION OF REFERENCE NUMERALS

B: Magnetic field
D: Electron trajectory
E: Electric field
S: Processing space
W: Wafer
10, 24, 39: Substrate processing space
11: Chamber
12: Susceptor
13: Upper electrode
14: First high frequency power supply
16: Second high frequency power supply
20, 40, 41: Electromagnet
21, 42: Central portion facing group 22, 43: Peripheral portion facing group
23, 44: Outer portion facing group

We claim:

1. A substrate processing method performed by a substrate processing apparatus that generates an electric field in a processing space between a lower electrode to which a high frequency power is applied and an upper electrode provided to face the lower electrode, and that performs a plasma process on a substrate mounted on the lower electrode with plasma generated by the electric field, the substrate processing apparatus comprising multiple electromagnets arranged on a top surface of the upper electrode opposite to the processing space, wherein:

each of the electromagnets is radially arranged with respect to a central portion of the upper electrode facing a central portion of the substrate,
the multiple electromagnets are divided into a first electromagnet group, a second electromagnet group, and a third electromagnet group,
the first electromagnet group includes the electromagnets facing the central portion of the substrate, the second electromagnet group includes the electromagnets facing a peripheral portion of the substrate, and the third electromagnet group includes the electromagnets arranged on an outside of the second electromagnet group with respect to the central portion of the upper electrode without facing the substrate, and
magnetic poles on the processing space side of the electromagnets belonging to the first electromagnet group are identical to each other, magnetic poles on the processing space side of the electromagnets belonging to the second electromagnet group are identical to each other, and magnetic poles on the processing space side of the electromagnets belonging to the third electromagnet group are identical to each other, and
the substrate processing method comprises:
setting a magnetic pole on the processing space side of each electromagnet belonging to any two adjacent electromagnet groups from among the first, second and third electromagnet groups to be same;
setting a magnetic pole on the processing space side of each electromagnet belonging to a remaining electromagnet group to be different from the magnetic pole on the processing space side of each electromagnet belonging to said any two adjacent electromagnet groups;
generating the electric field by applying the high frequency power to the lower electrode; and
performing a first process on the substrate with the plasma generated by the electric field.

2. The substrate processing method of claim 1,
wherein the magnetic pole on the processing space side of each electromagnet belonging to the first electromagnet group is set as an N pole, and the magnetic pole on the processing space side of each electromagnet belonging to the second electromagnet group and the third electromagnet group is set as an S pole.

3. The substrate processing method of claim 1,
wherein the magnetic pole on the processing space side of each electromagnet belonging to the first electromagnet group and the second electromagnet group is set as an N pole and the magnetic pole on the processing space side of each electromagnet belonging to the third electromagnet group is set as an S pole.

4. The substrate processing method of claim 1, further comprising:

performing a second process on the substrate after performing the first process,
wherein a first high frequency power supply that is configured to supply a high frequency power having a first high frequency and a second high frequency power supply that is configured to supply a high frequency power having a second high frequency higher than the first high frequency are connected to the lower electrode,
wherein the first process includes configuring the second frequency power supply to supply the high frequency power having the second high frequency, and
wherein the second process includes configuring the first frequency power supply to supply the high frequency power having the first high frequency, and
wherein in the second process, an electric current is not applied to each electromagnet belonging to the first, second and third electromagnet group so as not to generate a magnetic flux.

5. The substrate processing method of claim 4,
wherein the first process includes configuring the first frequency power supply not to supply the high frequency power having the first high frequency, and
wherein the second process includes configuring the second frequency power supply not to supply the high frequency power having the second high frequency.

6. The substrate processing method of claim 5,
wherein the magnetic pole on the processing space side of each electromagnet belonging to the first electromagnet group and the second electromagnet group is set as an N pole and the magnetic pole on the processing space side of each electromagnet belonging to the third electromagnet group is set as an S pole.

7. The substrate processing method of claim 1,
wherein a diameter of a rod-shaped yoke included in each electromagnet belonging to one group of the first, second and third electromagnet groups is different from a diameter of a rod-shaped yoke included in each electromagnet belonging to another group of the first, second and third electromagnet groups, and
wherein a winding number of a coil included in each electromagnet belonging to one group of the first, second and third electromagnet groups is different from a winding number of a coil included in each electromagnet belonging to another group of the first, second and third electromagnet groups.

8. A substrate processing method performed by a substrate processing apparatus that generates an electric field in a processing space between a lower electrode to which a high frequency power is applied and an upper electrode provided to face the lower electrode, and that performs a plasma process on a substrate mounted on the lower electrode with plasma generated by the electric field, the substrate processing apparatus comprising multiple electromagnets arranged on a top surface of the upper electrode opposite to the processing space, wherein:

each of the electromagnets is radially arranged with respect to a central portion of the upper electrode facing a central portion of the substrate,
the multiple electromagnets are divided into a first electromagnet group, a second electromagnet group, and a third electromagnet group,
the first electromagnet group includes the electromagnets facing the central portion of the substrate, the second electromagnet group includes the electromagnets facing a peripheral portion of the substrate, and the third electromagnet group includes the electromagnets arranged on an outside of the second electromagnet group with respect to the central portion of the upper electrode without facing the substrate, and magnetic poles on the processing space side of the electromagnets belonging to the first electromagnet group are identical to each other, magnetic poles on the processing space side of the electromagnets belonging to the second electromagnet group are identical to each other, and magnetic poles on the processing space side of the electromagnets belonging to the third electromagnet group are identical to each other, and the substrate processing method comprises:

setting a magnetic pole on the processing space side of each electromagnet belonging to one of the first, second and third electromagnet groups to be different from a magnetic pole on the processing space side of each electromagnet belonging to the other two electromagnet groups;

generating the electric field by applying the high frequency power to the lower electrode;

performing a first process on the substrate with the plasma generated by the electric field; and performing a second process on the substrate after performing the first process, wherein a first high frequency power supply that is configured to supply a high frequency power having a first high frequency and a second high frequency power supply that is configured to supply a high frequency power having a second high frequency higher than the first high frequency are connected to the lower electrode, wherein the first process includes configuring the second frequency power supply to supply the high frequency power having the second high frequency, wherein the second process includes configuring the first frequency power supply to supply the high frequency power having the first high frequency, and wherein in the second process, an electric current is not applied to each electromagnet belonging to the first, second and third electromagnet group so as not to generate a magnetic flux.

* * * * *